United States Patent
Lee et al.

(10) Patent No.: US 8,361,816 B2
(45) Date of Patent: Jan. 29, 2013

(54) METHOD OF MANUFACTURING VERTICAL GALLIUM NITRIDE BASED LIGHT EMITTING DIODE

(75) Inventors: Jae Hoon Lee, Suwon (KR); Jung Hee Lee, Daegu (KR); Hyun Ick Cho, Daegu (KR); Dae Kil Kim, Daegu (KR); Jae Chul Ro, Seoul (KR)

(73) Assignee: Samsung Electronics Co., Ltd., Seoul (KR)

( * ) Notice: Subject to any disclaimer, the term of this patent is extended or adjusted under 35 U.S.C. 154(b) by 235 days.

(21) Appl. No.: 11/634,106

(22) Filed: Dec. 6, 2006

(65) Prior Publication Data

US 2007/0134834 A1   Jun. 14, 2007

(30) Foreign Application Priority Data

Dec. 9, 2005 (KR) .................. 10-2005-0120599

(51) Int. Cl.
  *H01L 21/00* (2006.01)
(52) U.S. Cl. .................. 438/29; 438/751; 257/E33.074
(58) Field of Classification Search ............. 438/25–28, 438/FOR. 417, 22, 29, 31, 32, 36, 46, 47, 438/483, 745, 749–751, 753, 567, 604, 656, 438/459; 257/79, 95, 103, E21.085, E21.459, 257/E33.043, E33.067, E33.068, E33.003, 257/E33.005, E33.006, E33.071, E33.074, 257/98, E33.046, E33.063
See application file for complete search history.

(56) References Cited

U.S. PATENT DOCUMENTS

| | | | | |
|---|---|---|---|---|
| 5,657,335 A | * | 8/1997 | Rubin et al. | 372/44.01 |
| 5,773,369 A | * | 6/1998 | Hu et al. | 438/746 |
| 5,792,698 A | * | 8/1998 | Nishitani | 438/287 |
| 5,877,558 A | * | 3/1999 | Nakamura et al. | 257/749 |
| 5,929,466 A | * | 7/1999 | Ohba et al. | 257/103 |
| 6,270,929 B1 | * | 8/2001 | Lyons et al. | 430/5 |
| 6,884,646 B1 | * | 4/2005 | Wu et al. | 438/22 |
| 7,009,218 B2 | * | 3/2006 | Sugimoto et al. | 257/99 |
| 7,105,850 B2 | * | 9/2006 | Wu et al. | 257/13 |

(Continued)

FOREIGN PATENT DOCUMENTS

| JP | 2001298210 A | * | 10/2001 |
|---|---|---|---|
| JP | 2005085811 A | * | 3/2005 |

(Continued)

OTHER PUBLICATIONS

Keyan et al., "Evolution of AlN buffer layers on Silicon and the effect on the property of the expitaxial GaN film", Dspace@MIT, Nov. 2003, pp. 1-6.*

(Continued)

*Primary Examiner* — Matthew Landau
*Assistant Examiner* — Joseph C Nicely
(74) *Attorney, Agent, or Firm* — McDermott Will & Emery LLP

(57) ABSTRACT

A method of manufacturing a vertical GaN-based LED includes forming a nitride-based buffer layer on a silicon substrate; sequentially forming a p-type GaN layer, an active layer, and an n-type GaN layer on the nitride-based buffer layer; forming an n-electrode on the n-type GaN layer; forming a plating seed layer on the n-electrode; forming a structure supporting layer on the plating seed layer; removing the silicon substrate through wet etching and forming roughness on the surface of the p-type GaN layer through over-etching; and forming a p-electrode on the p-type GaN layer having the roughness formed.

11 Claims, 7 Drawing Sheets

U.S. PATENT DOCUMENTS

| | | | |
|---|---|---|---|
| 7,599,277 B1 * | 10/2009 | Kato et al. | 369/112.27 |
| 2002/0137236 A1 * | 9/2002 | Schaff et al. | 438/12 |
| 2003/0180980 A1 * | 9/2003 | Margalith et al. | 438/48 |
| 2003/0222263 A1 | 12/2003 | Choi | |
| 2004/0137657 A1 * | 7/2004 | Dmitriev et al. | 438/47 |
| 2004/0169188 A1 * | 9/2004 | Nunoue et al. | 257/98 |
| 2004/0173816 A1 * | 9/2004 | Saxler | 257/195 |
| 2004/0264533 A1 * | 12/2004 | Matsumura et al. | 372/45 |
| 2004/0266044 A1 * | 12/2004 | Park et al. | 438/46 |
| 2005/0007285 A1 * | 1/2005 | Oudar et al. | 343/738 |
| 2005/0167681 A1 * | 8/2005 | Kwak et al. | 257/79 |
| 2005/0247950 A1 * | 11/2005 | Nakamura et al. | 257/98 |
| 2006/0126694 A1 * | 6/2006 | Kwon et al. | 372/50.124 |
| 2006/0154390 A1 * | 7/2006 | Tran et al. | 438/22 |
| 2006/0154455 A1 * | 7/2006 | Guo et al. | 438/483 |
| 2006/0175701 A1 * | 8/2006 | Gross | 257/734 |
| 2006/0189123 A1 * | 8/2006 | Saitou et al. | 438/622 |
| 2006/0223313 A1 * | 10/2006 | Yoon et al. | 438/687 |
| 2006/0255341 A1 * | 11/2006 | Pinnington et al. | 257/79 |
| 2006/0256825 A1 * | 11/2006 | Matsumura et al. | 372/43.01 |
| 2006/0267152 A1 * | 11/2006 | Forbes | 257/617 |
| 2007/0018187 A1 * | 1/2007 | Lee et al. | 257/79 |
| 2007/0121690 A1 * | 5/2007 | Fujii et al. | 372/43.01 |
| 2007/0148923 A1 * | 6/2007 | Kim et al. | 438/483 |
| 2007/0205087 A1 * | 9/2007 | Pashby et al. | 200/181 |
| 2007/0221944 A1 * | 9/2007 | Cheol Yoo | 257/99 |
| 2007/0238314 A1 * | 10/2007 | Buretea et al. | 438/775 |
| 2007/0264805 A1 * | 11/2007 | Guenter et al. | 438/483 |
| 2008/0017868 A1 * | 1/2008 | Yoneda | 257/79 |
| 2008/0035936 A1 * | 2/2008 | Lester | 257/79 |
| 2008/0089383 A1 * | 4/2008 | Liu et al. | 374/44 |
| 2008/0093611 A1 * | 4/2008 | Hahn et al. | 257/95 |
| 2008/0135868 A1 * | 6/2008 | Okagawa et al. | 257/99 |
| 2008/0194050 A1 * | 8/2008 | Saito et al. | 438/27 |
| 2008/0224154 A1 * | 9/2008 | Jiang et al. | 257/88 |
| 2009/0121242 A1 * | 5/2009 | Watanabe et al. | 257/96 |
| 2009/0121657 A1 * | 5/2009 | Erchak et al. | 315/312 |
| 2009/0130787 A1 * | 5/2009 | Bader et al. | 438/29 |
| 2009/0174035 A1 * | 7/2009 | Kano et al. | 257/615 |
| 2009/0189192 A1 * | 7/2009 | Lieten et al. | 257/200 |
| 2009/0289330 A1 * | 11/2009 | Shibata | 257/615 |
| 2009/0291313 A1 * | 11/2009 | Datta et al. | 428/450 |

FOREIGN PATENT DOCUMENTS

| | | | |
|---|---|---|---|
| WO | WO 00/28536 A1 | * | 5/2000 |
| WO | WO0229873 A1 | * | 4/2002 |
| WO | WO 2005/106972 | * | 11/2005 |
| WO | WO 2005106972 A1 | * | 11/2005 |

OTHER PUBLICATIONS

Pal et al., "Silicon—a new substrate for GaN growth", Bulletin of Material Science, Dec. 2004, vol. 27, Issue No. 6, pp. 501-504.*

Na et al., "Surface texturing of p-GaN layer for efficient GaN LED by maskless selective etching", Physica Status Solidi (c), Apr. 2005, vol. 2, Issue No. 7, pp. 2916-2919.*

Nikishin et al., "High quality GaN grown on Si(111) by gas source molecular beam epitaxy with ammonia", Applied Physics Letters, Oct. 1999, vol. 75, Issue No. 14, pp. 2073-2075.*

Jones et al. "Wet-Chemical Etching and Cleaning of Silicon", Apr. 2004, pp. 1-12, http://www.virginiasemi.com/pdf/siliconetchingandcleaning.pdf.*

Cho et al. "Amphoteric Behavior of Impurities in GaN Film Grown on Si Substrate", Apr. 27, 2007, Japanese Journal of Applied Physics, vol. 46, No. 18, pp. L423-L426.*

Gurskii et al. "Luminescence Properties of Strained GaN Epilayers and Spatial Configurations of Silicon Impurity and Related Defects", 2002, Phys. Stat. Sol. (c), vol. 0, No. 1, pp. 425-429.*

Hikosaka et al. "Optical and electrical properties of (1-101)GaN grown on a 7 degree off-axis (001) Si substrate" Jun. 7, 2004, Applied Physics Letters, vol. 84, No. 23, pp. 4717-4719.*

Jayapalan et al. "Optical spectroscopy of Si-related donor and acceptor levels in Si-doped GaN grown by hydride vapor phase epitaxy", Aug. 1998, Applied Physics Letters, vol. 73, No. 9, pp. 1188-1190.*

"MOCVD reactor", Feb. 6, 2005, http://www.anu.edu.au/CSEM/machines/MOCVD.htm, pp. 1.*

Pearton et al., "Ion implantation doping and isolation of GaN," Sep. 4, 1995, Appl. Phys. Lett. 67 (10), pp. 1435-1437.*

Kim et al. "Investigate of Ta/Ti/Al/Ni/Au ohmic contact to AlGaN/GaN heterostructure field-effect transistor" J. Vac. Sci Technol. B 23(1), Jan. 26, 2005.*

* cited by examiner $N_1 \sin \theta_1 = N_2 \sin \theta_2$

- PRIOR ART -

- PRIOR ART -

- PRIOR ART -

- PRIOR ART -

- PRIOR ART -

- PRIOR ART -

- PRIOR ART -

- PRIOR ART -

METHOD OF MANUFACTURING VERTICAL GALLIUM NITRIDE BASED LIGHT EMITTING DIODE

CROSS-REFERENCE TO RELATED APPLICATIONS

The application claims the benefit of Korea Patent Application No. 2005-120599 filed with the Korea Intellectual Property Office on Dec. 9, 2005, the disclosure of which is incorporated herein by reference.

BACKGROUND OF THE INVENTION

1. Field of the Invention

The present invention relates to a method of manufacturing a vertical (vertical-electrode-type) GaN-based light emitting diode (LED), which is capable of increasing the light-extraction efficiency to enhance the external quantum efficiency and simultaneously simplifying an overall manufacturing process.

2. Description of the Related Art

Generally, a GaN-based LED is grown on a sapphire substrate, but the sapphire substrate is a rigid nonconductor and has poor thermal conductivity. Therefore, there is a limitation in reducing the manufacturing costs by decreasing the size of a GaN-based LED, or improving the optical power and chip characteristic. Particularly, because the application of a high current is essential for achieving high power LED, it is important to solve a heat-sink problem of the LED. To solve this problem, there has been proposed a vertical GaN-based LED in which a sapphire substrate is removed using a laser lift-off (LLO).

However, the conventional vertical GaN-based LED has a problem in that photon generated from an active layer is emitted to the outside of the LED. That is, the external quantum efficiency is degraded.

FIG. 1 is a diagram for explaining the reduction in external quantum efficiency in a conventional vertical GaN-based LED. Referring to FIG. 1, an incident angle $\theta_1$ at which photons are incident from a GaN layer to the air should be less than a critical angle $\theta_c$ so that the photons generated from an active layer can pass through the GaN layer having a refractive index $N_1$ greater than a refractive index $N_2$ of the air and then escape into the air.

When an escape angle $\theta_2$ at which the photon escapes into the air is 90°, the critical angle $\theta_c$ is defined as $\theta_c = \sin^{-1}(N_2/N_1)$. When light propagates from the GaN layer to the air having a refractive index of 1, a critical angle is about 23.6°.

When the incident angle $\theta_1$ is greater than the critical angel $\theta_c$, the photon is totally reflected at an interface between the GaN layer and the air and goes back into the LED. Then, the photon is confined inside the LED, so that the external quantum efficiency is greatly reduced.

To prevent the reduction in the external quantum efficiency, U.S Patent Publication No. 20030222263 discloses that hemispherical convex patterns are formed on the surface of an n-type GaN layer to reduce an incident angle $\theta_1$ of photon incident to the air from the GaN layer below a critical angle $\theta_c$.

A method for manufacturing a vertical GaN-based LED disclosed in U.S. Patent Publication No. 20030222263 will be described with reference to FIGS. 2 to 4.

FIGS. 2A to 2C are sectional views illustrating a method of manufacturing the vertical GaN-based LED disclosed in U.S. Patent Publication No. 20030222263, FIGS. 3A to 3C are enlarged sectional views illustrating a method of manufacturing the vertical GaN-based LED, and FIG. 4 is a sectional view of the vertical GaN-based LED manufactured through the method of FIGS. 2A to 2C and FIGS. 3A to 3C.

Referring to FIG. 2A, an LED structure 16 including GaN and a positive electrode (p-electrode) 18 are formed on a sapphire substrate 24, and a first Pd layer 26 and an In layer 28 are formed on the p-electrode 18. Further, a second Pd layer is formed under a silicon substrate 20.

Referring to FIG. 2B, the silicon substrate 20 where the second Pd layer 30 is formed is attached to the p-electrode 18 where the first Pd layer 26 and the In layer 28 are formed.

Referring to FIG. 2C, the sapphire substrate 24 is removed using an LLO process.

Referring to FIG. 3A, photoresist patterns 32 are formed on predetermined portions of the surface of the exposed LED structure 16 (more specifically, the surface of the n-type GaN layer) after the sapphire substrate 24 is removed.

Referring to FIG. 3B, the photoresist patterns 32 are formed in a hemispherical shape through a re-flow process.

Referring to FIG. 3C, the surface of the LED structure 16 is etched through an anisotropic etching process so as to be patterned in a hemispherical shape.

Referring to FIG. 4, a negative electrode (n-electrode) 34 is formed on the LED structure 16. Through these procedures, the vertical GaN-based LED having the LED structure 16 whose surface is patterned is completed.

However, according to the vertical GaN-based LED manufactured by the method disclosed in U.S. Patent Publication No. 20030222263, when the LED structure 16 has a thickness of 10 µm or less (thin GaN), the process of forming the photoresist patterns 32 and subsequent processes are difficult to carry out even if the silicon substrate acting as a sub support is used. Accordingly, the manufacturing yield significantly decreases.

In addition, because the patterns for improving the external quantum efficiency are formed in a convex hemispherical shape on the surface of the LED structure, the surface of the LED structure on which the patterns can be formed is limited. Accordingly, the improvement of the external quantum efficiency that can be achieved by applying the convex hemispherical patterns is not sufficient. Therefore, there is a demand for a new method that can maximize the improvement of the external quantum efficiency.

SUMMARY OF THE INVENTION

An advantage of the present invention is that it provides a method of manufacturing a vertical GaN-based LED, in which a p-type GaN layer is formed on a silicon substrate by using a nitride-based buffer layer without a separate doping process, and the surface of the p-type GaN layer is formed to have roughness through a wet etching process for removing the silicon substrate, the roughness being capable of scattering light. Therefore, the light extraction efficiency is enhanced, so that the external quantum efficiency can be improved, and simultaneously, an overall manufacturing process can be simplified.

Additional aspects and advantages of the present general inventive concept will be set forth in part in the description which follows and, in part, will be obvious from the description, or may be learned by practice of the general inventive concept.

According to an aspect of the invention, a method of manufacturing a vertical GaN-based LED comprises forming a nitride-based buffer layer on a silicon substrate; sequentially forming a p-type GaN layer, an active layer, and an n-type GaN layer on the nitride-based buffer layer; forming an n-electrode on the n-type GaN layer; forming a plating seed layer on the n-electrode; forming a structure supporting layer on the plating seed layer; removing the silicon substrate through wet etching and forming roughness on the surface of the p-type GaN layer through over-etching; and forming a p-electrode on the p-type GaN layer having the roughness formed.

According to another aspect of the invention, the nitride-based buffer layer is formed of AlN.

According to a further aspect of the invention, the AlN is formed at temperature of more than 1000° C.

According to a still further aspect of the invention, the p-type GaN layer is formed to have a thickness of λ/4 of wavelength of light emitted in the active layer.

According to a still further aspect of the invention, the p-type GaN layer is formed to have a thickness of more than 500 nm.

According to a still further aspect of the invention, the wet-etching for removing the silicon substrate is performed by using a KOH solution as etching liquid.

According to a still further aspect of the invention, the method further comprises forming a transparent conductive layer on the p-type GaN layer having the roughness formed, prior to the forming of the p-electrode.

According to a still further aspect of the invention, the transparent conductive layer is formed of CIO/ITO.

According to a still further aspect of the invention, the n-electrode is formed of Ta/Ti/Al/Ni/Au or Al/Ti.

According to a still further aspect of the invention, the p-electrode is formed of Ni/Au.

According to a still further aspect of the invention, the plating seed layer is formed of Cr/Au.

According to a still further aspect of the invention, the structure supporting layer is formed by electroplating or non-electroplating using any one selected from a group consisting of Ni, Au, and Cu.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
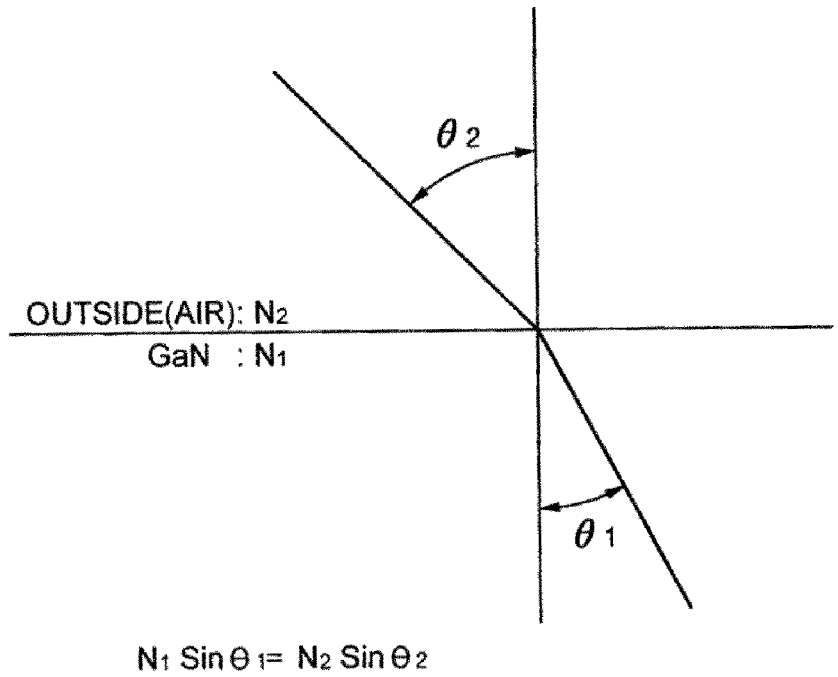
FIG. 1 is a diagram for explaining the reduction in external quantum efficiency in a conventional vertical GaN-based LED.
Figure 2A:
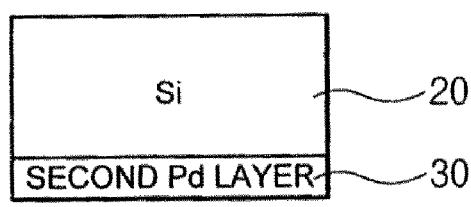
FIGS. 2A to 2C are sectional views illustrating a method of manufacturing the vertical GaN-based LED disclosed in U.S. Patent Publication No. 20030222263.
Figure 2A:
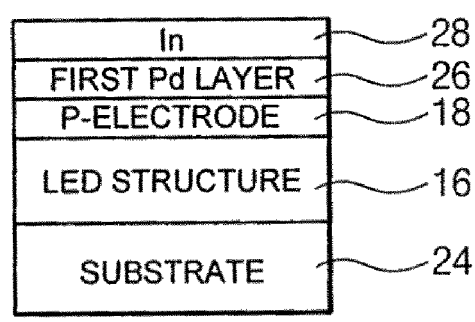
Figure 2B:
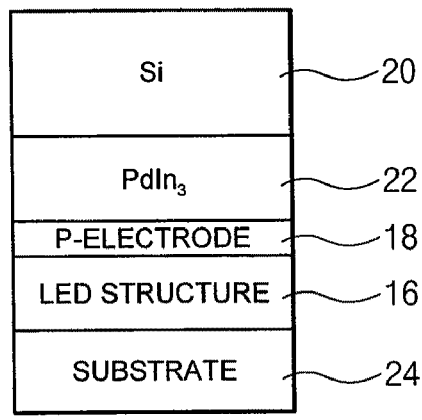
Figure 2C:
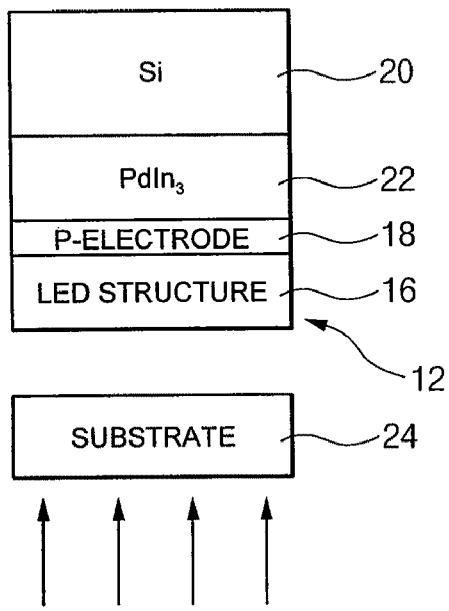
Figure 3A:
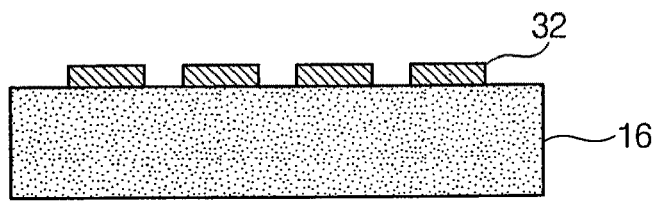
FIGS. 3A to 3C are enlarged sectional views illustrating a method of manufacturing the vertical GaN-based LED.
Figure 3B:
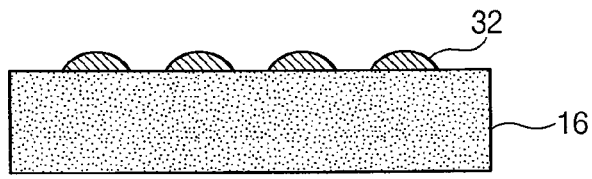
Figure 3C:
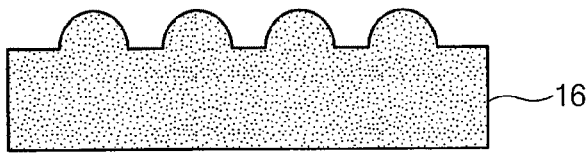
Figure 4:
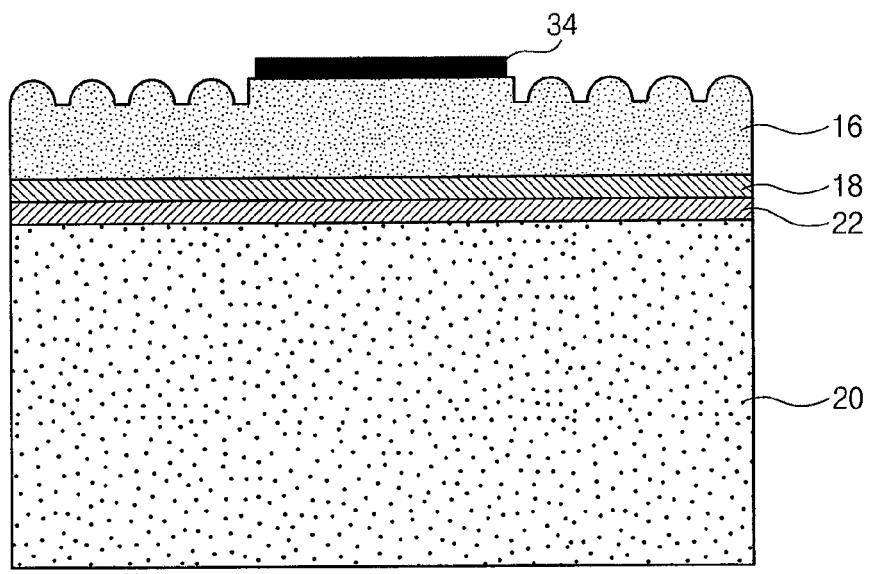
FIG. 4 is a sectional view of the vertical GaN-based LED manufactured through the method of FIGS. 2A to 2C and FIGS. 3A to 3C FIGS. 5A to 5E are sectional views sequentially illustrating the method of manufacturing a vertical GaN-based LED according to an embodiment of the present invention.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, a method of manufacturing a vertical GaN-based LED according to an embodiment of the invention will be described in detail with reference to the accompanying drawings.

First, the method of manufacturing a vertical GaN-based LED will be described in detail with reference to FIGS. 5A to 5E.

FIGS. 5A to 5E are sectional views sequentially illustrating the method of manufacturing a vertical GaN-based LED.

Figure 5A:
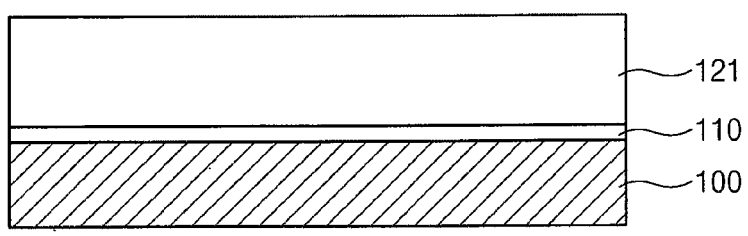

Referring to FIG. 5A, an AlN buffer layer 110 is formed on a silicon substrate 100 having an upper surface with a crystal direction (111) by using the MOCVD method through a nitride single crystal growth process. Preferably, the AlN buffer layer 110 is grown at temperature of more than 1000° C.

On the AlN buffer layer 110, a p-type GaN layer 121 is formed. Preferably, the p-type GaN layer 121 is formed to have a thickness of about λ/4 (more than 500 nm) in order to secure a forming margin of roughness which is to be formed on the surface thereof through the following process.

The p-type GaN layer 121 according to the invention is not formed by performing a separate p-type doping process on a GaN single crystal layer. At the time of growing GaN single crystal, the p-type GaN layer 121 is formed when silicon (Si) atoms having an amphoteric characteristic act as an acceptor on a GaN layer with tensile strain, the silicon atoms being diffused from the silicon substrate 100 disposed under the p-type GaN layer 121. More specifically, when the silicon (Si) atoms diffused from the silicon substrate 100 are combined with nitrogen (N) atoms of the GaN layer having tensile strain so as to form SiN and act as an acceptor, the GaN layer has a p-type characteristic (see Phys. Stat. Sol (c) No. 1, 425~429, 2002, Appl. Phys. Letters, Vol. 73, p 1188~1988).

Figure 6:
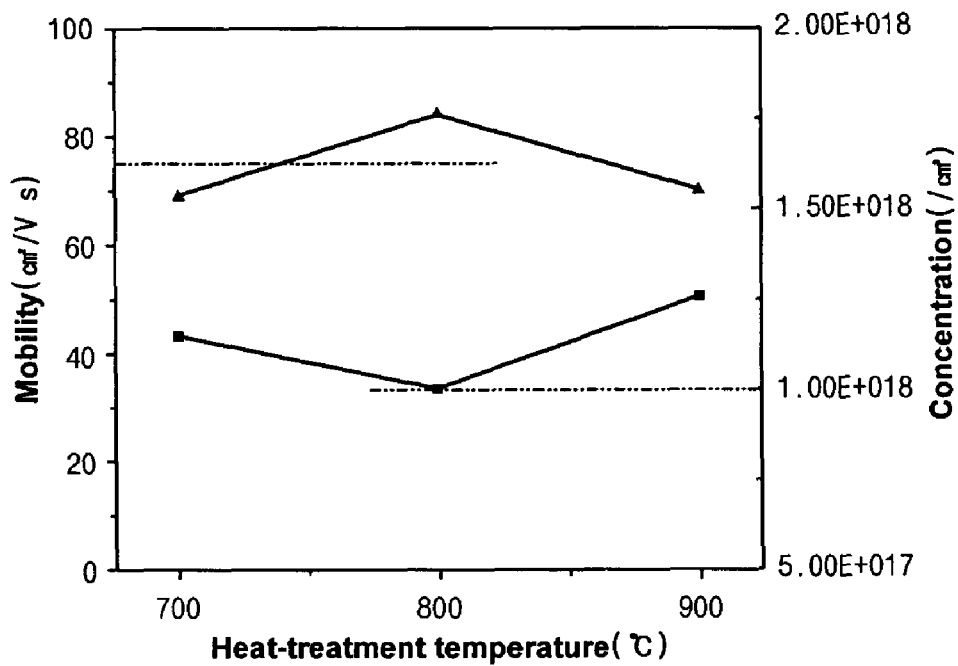
FIG. 6 is a graph showing a change in mobility and concentration of holes of the p-type GaN layer manufactured through the invention in accordance with heat treatment.

When the p-type GaN layer 121 is manufactured in such a manner, a heat treatment process may be omitted, which is performed so as to activate a doped p-type ion within a GaN layer. FIG. 6 is a graph showing a change in mobility and concentration of holes of the p-type GaN layer manufactured through the present invention in accordance with heat treatment. In the p-type GaN layer 121 manufactured according to the invention, the concentration of ion having a p-type characteristic hardly changes in accordance with a change in temperature of the heat treatment, and the mobility thereof hardly changes, as shown in FIG. 6.

Therefore, when the p-type GaN layer is manufactured according to the present invention, it is possible to omit a separate process of doping p-type ion and a heat treatment process of activating the p-type ion, thereby simplifying a manufacturing process.

Figure 5B:
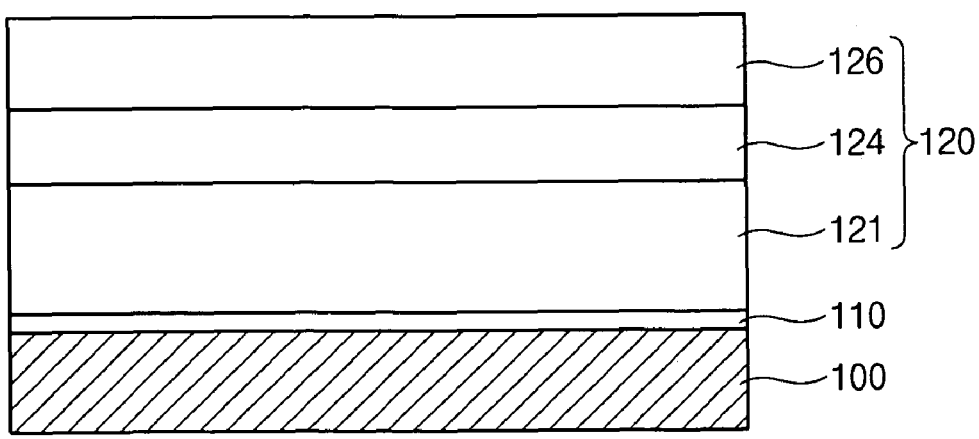

As shown in FIG. 5B, an active layer 124 and an n-type GaN layer 126 are sequentially crystal-grown on the p-type GaN layer 121 so as to form a light-emitting structure 120 in which the p-type GaN layer 121, the active layer 124, and the n-type GaN layer 126 are sequentially laminated.

Figure 5C:
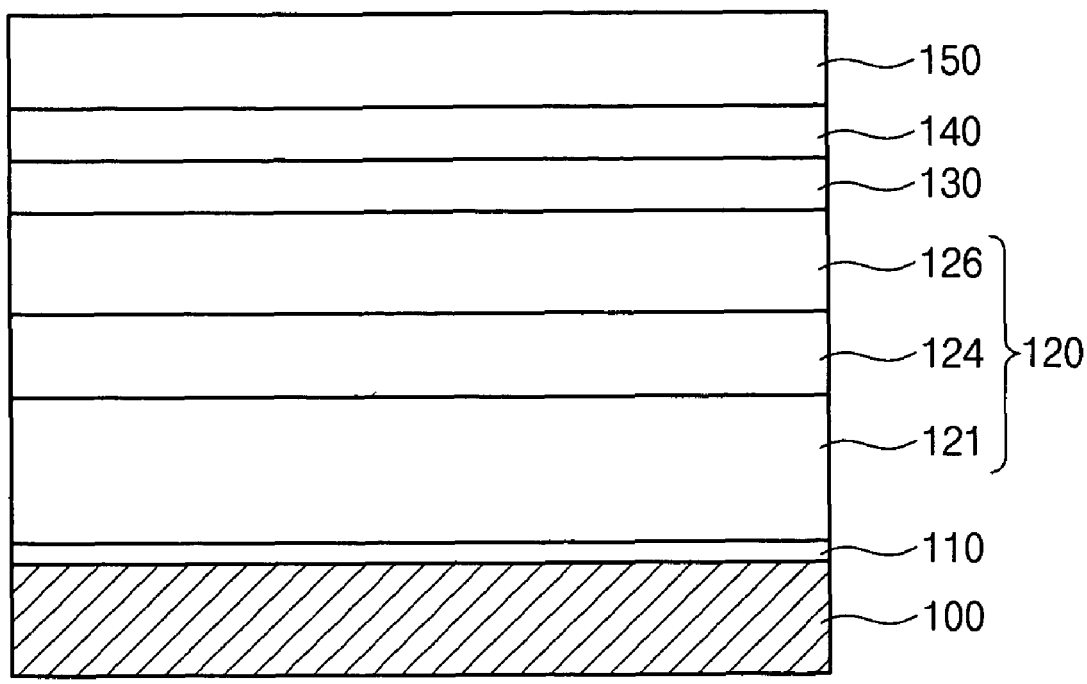

As shown in FIG. 5C, an n-electrode 130 is formed on the n-type GaN layer 126. At this time, the n-electrode 130 can serve as a reflective film. On the other hand, a separate reflective film (not shown) may be formed on the n-electrode 130. In this embodiment, the n-electrode 130 is formed by using Ta/Ti/Al/Ni/Au or Al/Ti.

Figure 7:
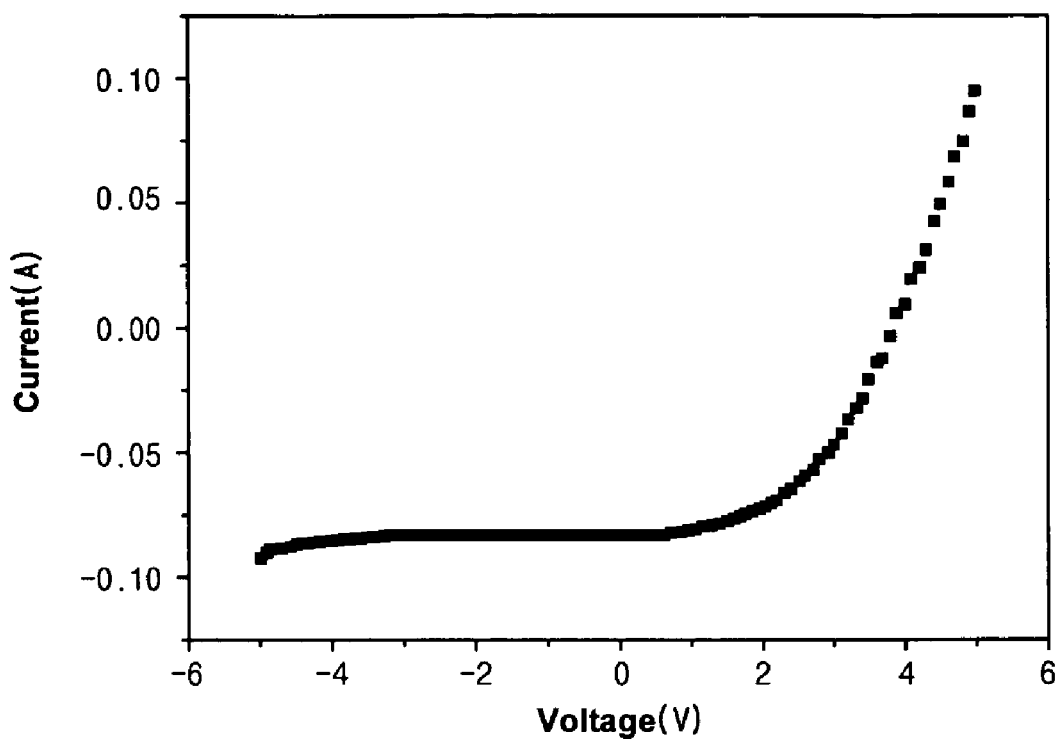
FIG. 7 is a graph showing a voltage-current characteristic of an n-electrode in accordance with the p-type GaN layer manufactured through the invention.

In this embodiment, the n-electrode 130 is formed of Ta/Ti/Al/Ni/Au. Then, an n-electrode characteristic is verified in order to find a characteristic of the p-type GaN layer 121 manufactured according to the invention. As shown in FIG. 7, it can be found that it normally shows a schottky characteristic.

Next, after a plating seed layer 140 is formed of Cr/Au on the n-electrode 130, a structure supporting layer 150 composed of a plating layer is formed on the plating seed layer 140 by performing electroplating or non-electroplating of Ni, Au, Cu or the like. At this time, the plating seed layer 140 serves a crystal nucleus when the electroplating or non-electroplating is performed to form the structure supporting layer.

Figure 5D:
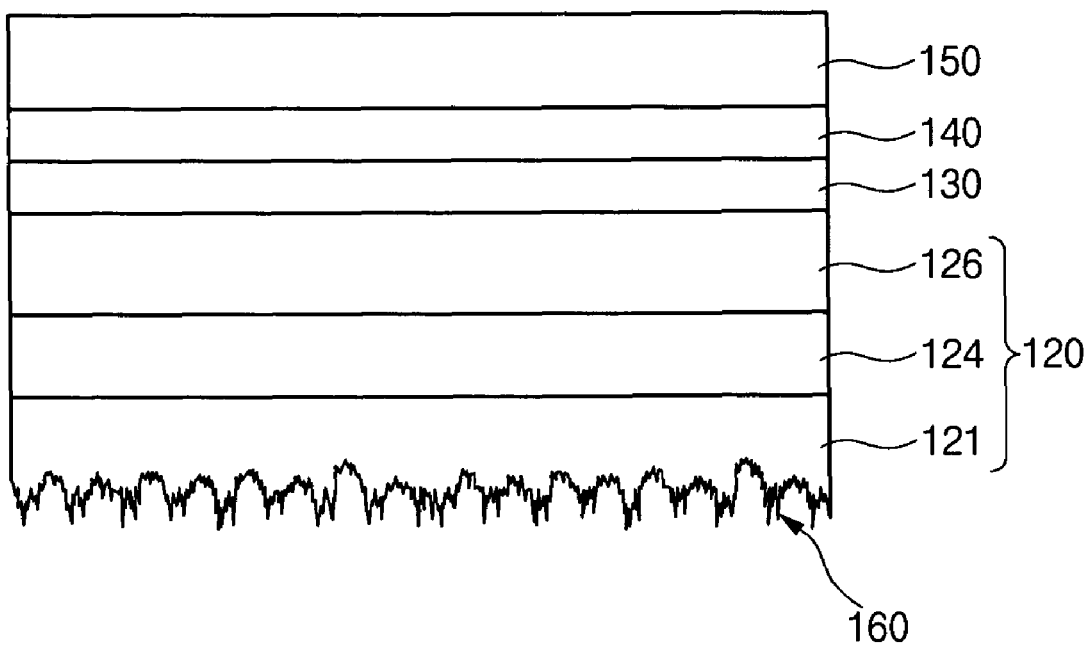

Next, as shown in FIG. 5D, the silicon substrate 100 is removed by wet etching. In this case, the nitride-based buffer layer 110 positioned over the silicon substrate 100 and portions of the surface of the p-type GaN layer are also etched through over-etching. Then, roughness 160, which is capable of scattering light, is formed on the surface of the p-type GaN layer.

At this time, the direction and structure of the roughness 160 are determined by the crystal direction of the etched layer. Accordingly, the roughness 160 has a minute structure having a light scattering effect. The wet-etching process for obtaining preferable roughness 160 can be performed at temperature of 75 to 100° C. by using etching liquid such as KOH.

The roughness 160 may be formed by performing wet etching using etching liquid such as KOH together with dry etching using ICP-RIE.

Figure 5E:
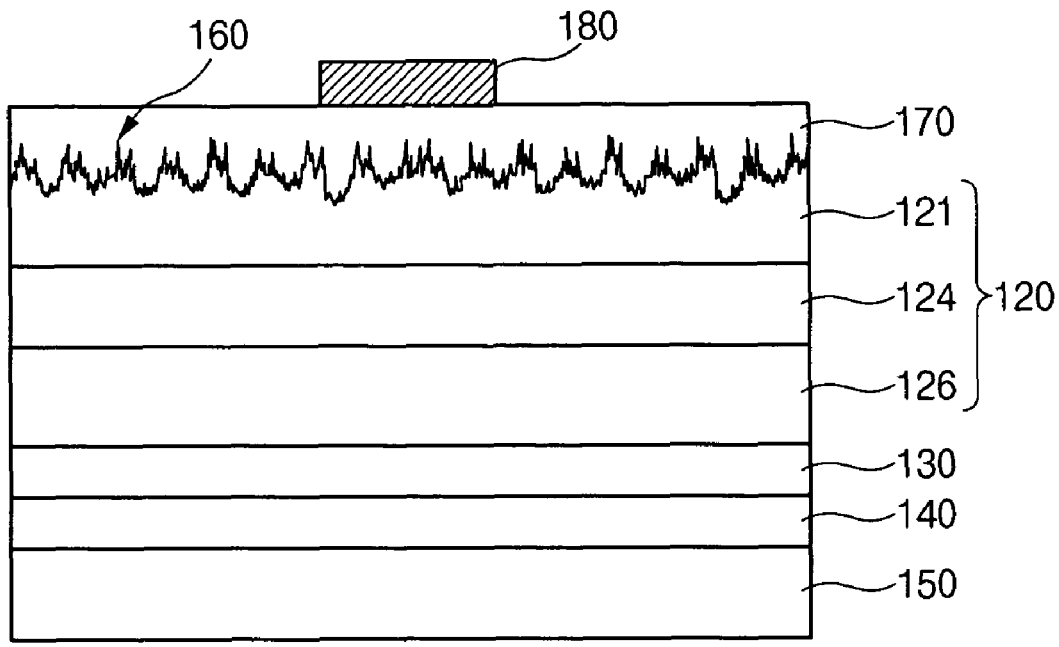

Next, as shown in FIG. 5E, a p-electrode 180 is formed on the p-type GaN layer 121 having the roughness 160 formed. Then, an element separation process is performed through laser scribing, wet etching or dry etching. Alternately, the p-electrode 180 is formed after the element separation process, thereby forming a vertical GaN-based LED.

Figure 8:
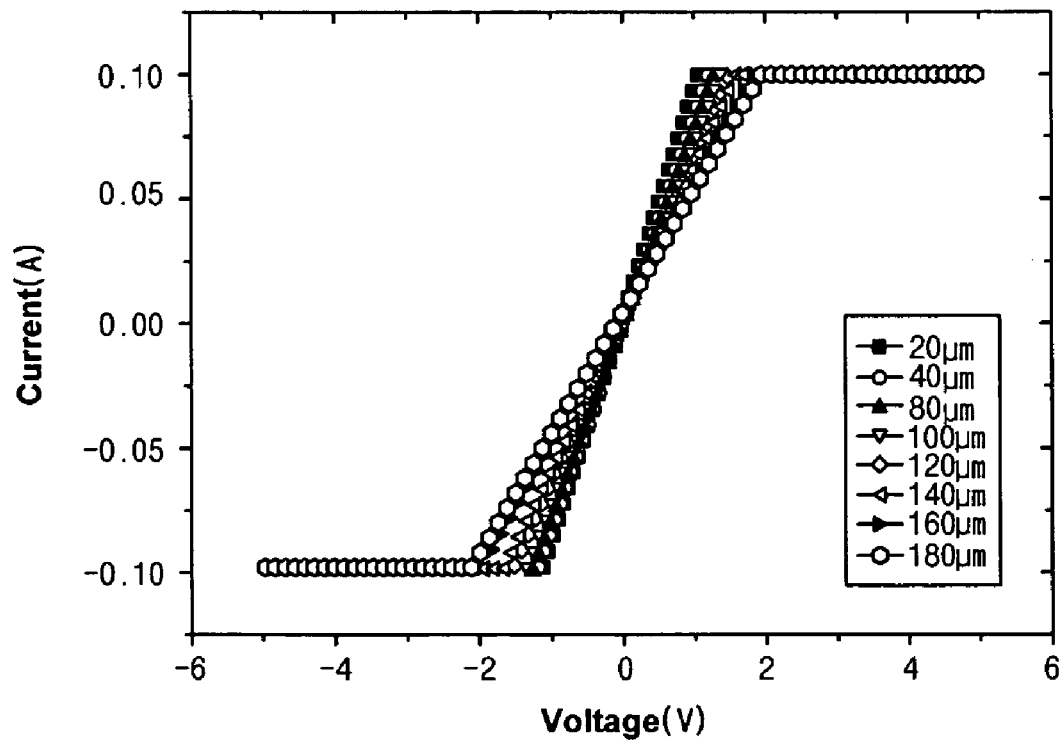
FIG. 8 is a graph showing a voltage-current characteristic of a p-electrode in accordance with the p-type GaN layer manufactured through the invention.

In this embodiment, the p-electrode 180 is formed of Ni/Au. Then, characteristics of the p-electrode are verified in order to find out the characteristics of the p-type GaN layer 121 manufactured according to the invention. As a result, it can be found that the p-electrode normally shows an ohmic characteristic, as shown in FIG. 8.

In this embodiment, in order to enhance a current spreading effect, a transparent conductive layer 170 may be formed on the entire upper surface of the p-type GaN layer 121 by using CIO/ITO, before the p-electrode 180 is selectively formed.

As described above, the p-type GaN layer is formed on the silicon substrate by using the nitride-based buffer layer without a separate doping process, and simultaneously, a heat treatment process for activating doping ion can be omitted, which makes it possible to simplify an overall manufacturing process.

Further, the roughness for scattering light is easily formed on the surface of the p-type GaN layer without a separate photolithographic process, thereby enhancing the light extraction efficiency and maximizing an improved effect of external quantum efficiency.

In the present invention, the characteristics and reliability of the vertical GaN-based LED can be enhanced, and simultaneously, an overall manufacturing process can be simplified, which makes it possible to increase production yield.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a vertical GaN-based LED, comprising:
    forming a nitride-based buffer layer on a silicon substrate;
    forming a p-type GaN layer on the nitride-based buffer layer;
    sequentially forming an active layer and an n-type GaN layer on the p-type GaN layer;
    forming an n-electrode on the n-type GaN layer;
    forming a plating seed layer on the n-electrode;
    forming a structure supporting layer on the plating seed layer;
    removing the silicon substrate through wet etching and forming roughness on the entirety of a surface of the p-type GaN layer through over-etching;
    forming a p-electrode on the p-type GaN layer having the roughness formed; and forming a transparent conductive layer on the p-type GaN layer having the roughness formed thereon, prior to the forming of the p-electrode,
    wherein the removing the silicon substrate and the forming roughness on the entirety of the surface of the p-type GaN layer are performed in a single etching process of wet etching,
    wherein the p-type GaN layer has a thickness of more than 500 nm, and
    wherein the n-electrode is formed of Ta, Ti, Al, Ni and Au.

2. The method according to claim 1, wherein the nitride-based buffer layer is formed of AlN.

3. The method according to claim 2, wherein the AlN is formed at a temperature of more than 1000° C.

4. The method according to claim 1, wherein the p-type GaN layer is formed to have a thickness of ¼ of wavelength of light emitted in the active layer.

5. The method according to claim 1, wherein the wet-etching for removing the silicon substrate is performed by using a KOH solution as etching liquid.

6. The method according to claim 1, wherein the transparent conductive layer is formed of CIO/ITO.

7. The method according to claim 1, wherein the p-electrode is formed of Ni/Au.

8. The method according to claim 1, wherein the plating seed layer is formed of Cr/Au.

9. The method according to claim 1, wherein the structure supporting layer is formed by electroplating or non-electroplating using any one selected from a group consisting of Ni, Au, and Cu.

10. The method according to claim 1, wherein the roughness is formed at temperature of 75° C. to 100° C.

11. The method according to claim 1, wherein the n-electrode is formed by stacking Ta, Ti, Al, Ni and Au in that order.

* * * * *